US008802530B2

(12) United States Patent
Wang et al.

(10) Patent No.: US 8,802,530 B2
(45) Date of Patent: Aug. 12, 2014

(54) MOSFET WITH IMPROVED PERFORMANCE THROUGH INDUCED NET CHARGE REGION IN THICK BOTTOM INSULATOR

(75) Inventors: Xiaobin Wang, San Jose, CA (US);
Anup Bhalla, Santa Clara, CA (US);
Daniel Ng, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/490,138

(22) Filed: Jun. 6, 2012

(65) Prior Publication Data

US 2013/0328121 A1    Dec. 12, 2013

(51) Int. Cl.
*H01L 21/336* (2006.01)
*H01L 29/78* (2006.01)
*H01L 21/42* (2006.01)

(52) U.S. Cl.
CPC ............ *H01L 21/42* (2013.01); *H01L 29/7813* (2013.01)
USPC ...... 438/270; 257/330; 257/332; 257/E29.26; 257/E21.419

(58) Field of Classification Search
CPC .......................... H01L 29/7813; H01L 21/42
USPC ............. 257/329, 330, 332, E29.26, E21.41, 257/E21.419; 438/270, 272
See application file for complete search history.

(56) References Cited

U.S. PATENT DOCUMENTS

| 6,545,316 | B1 * | 4/2003 | Baliga ........................... 257/329 |
| 6,674,124 | B2 * | 1/2004 | Hshieh et al. ................. 257/330 |
| 6,710,403 | B2 | 3/2004 | Sapp |
| 6,882,000 | B2 * | 4/2005 | Darwish et al. ............... 257/307 |
| 7,504,303 | B2 | 3/2009 | Yilmaz |
| 8,159,021 | B2 * | 4/2012 | Hshieh .......................... 257/328 |
| 8,187,939 | B2 | 5/2012 | Tai et al. |
| 8,310,001 | B2 * | 11/2012 | Darwish et al. ............... 257/330 |
| 8,372,708 | B2 * | 2/2013 | Bhalla et al. .................. 438/206 |
| 2003/0030092 | A1 * | 2/2003 | Darwish et al. ............... 257/302 |
| 2004/0031987 | A1 | 2/2004 | Henninger et al. |
| 2006/0211179 | A1 * | 9/2006 | Siemieniec et al. .......... 438/138 |
| 2006/0273386 | A1 | 12/2006 | Yilmaz et al. |
| 2007/0194374 | A1 | 8/2007 | Bhalla et al. |
| 2010/0013552 | A1 * | 1/2010 | Darwish et al. ............... 327/581 |
| 2011/0073938 | A1 * | 3/2011 | Takahashi ..................... 257/328 |
| 2011/0133272 | A1 * | 6/2011 | Mauder et al. ................ 257/335 |

* cited by examiner

*Primary Examiner* — Allan R Wilson
(74) *Attorney, Agent, or Firm* — Joshua D. Isenberg; JDI Patent

(57) ABSTRACT

A semiconductor power device includes a thick bottom insulator formed in a lower portion of a trench in a semiconductor epitaxial region. An electrically conductive gate electrode is formed in the trench above the bottom insulator. The gate electrode is electrically insulated from the epitaxial region by the bottom insulator and a gate insulator. Charge is deliberately induced in the thick bottom insulator proximate an interface between the bottom insulator and the epitaxial semiconductor region. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

19 Claims, 7 Drawing Sheets

TBO trench MOSFET with electron irradiation

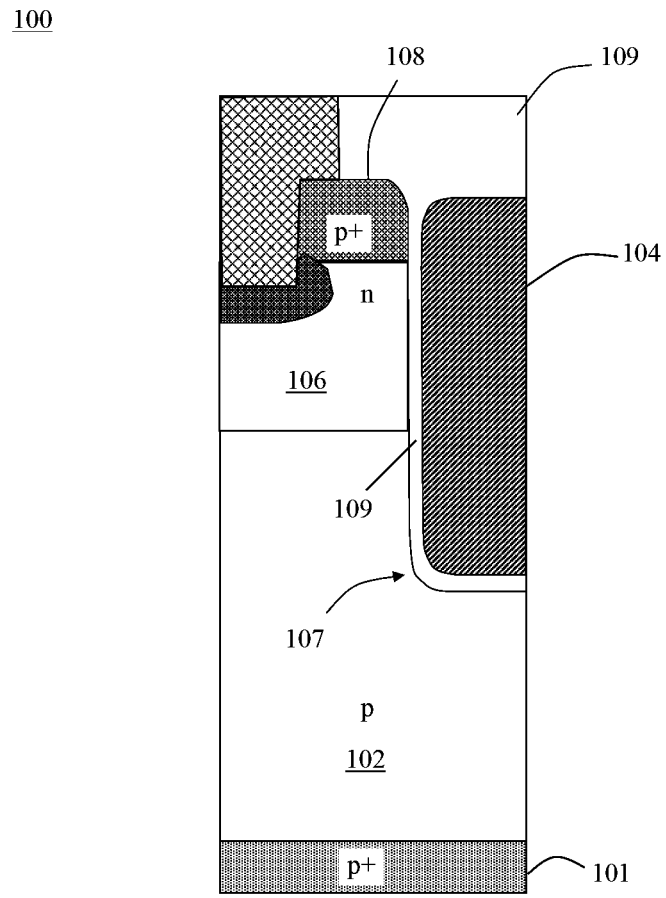
FIG. 1A – Conventional trench MOSFET

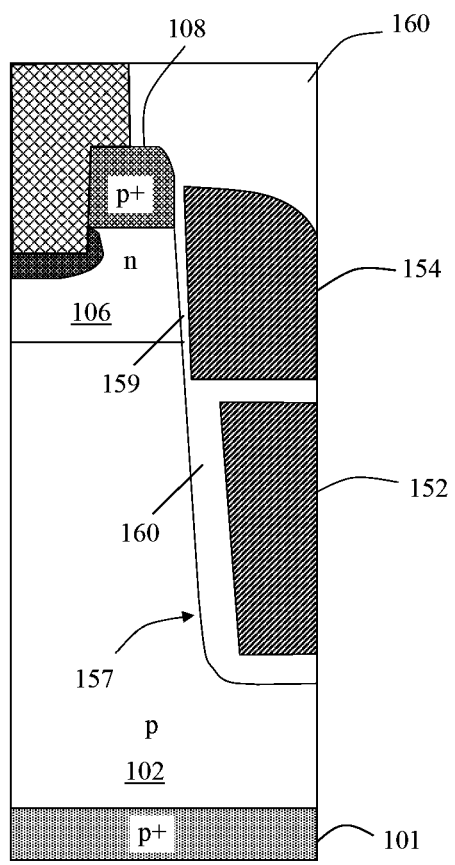
FIG. 1B – Conventional SGT MOSFET

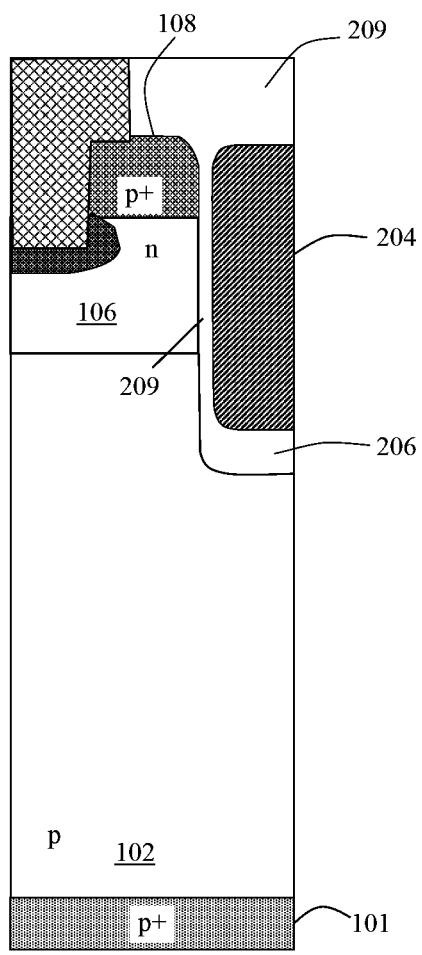
FIG. 2A-TBO trench MOSFET

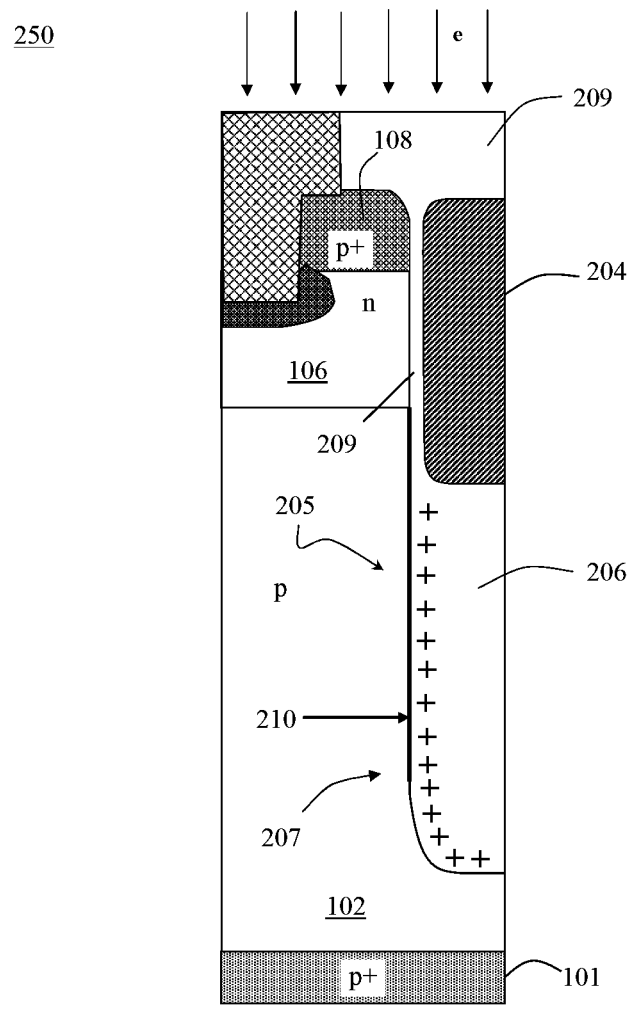
FIG. 2B – TBO trench MOSFET with electron irradiation

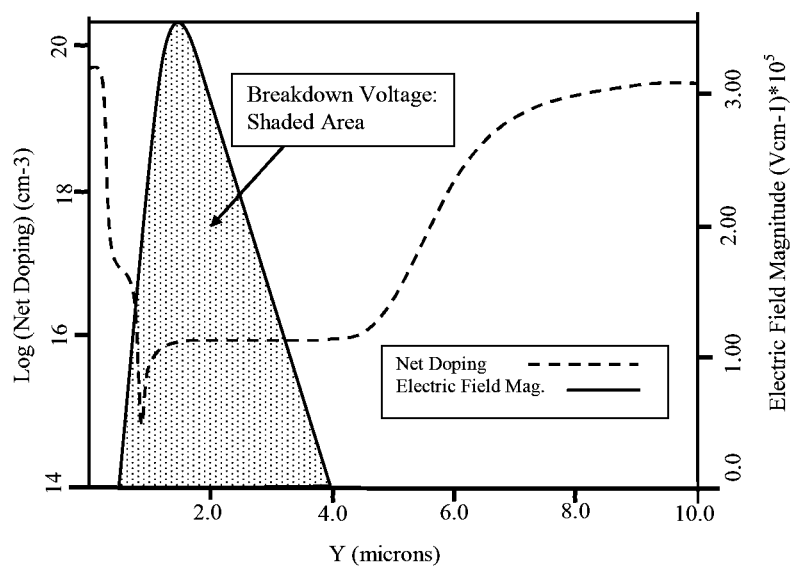
FIG. 3A – Conventional trench MOSFET

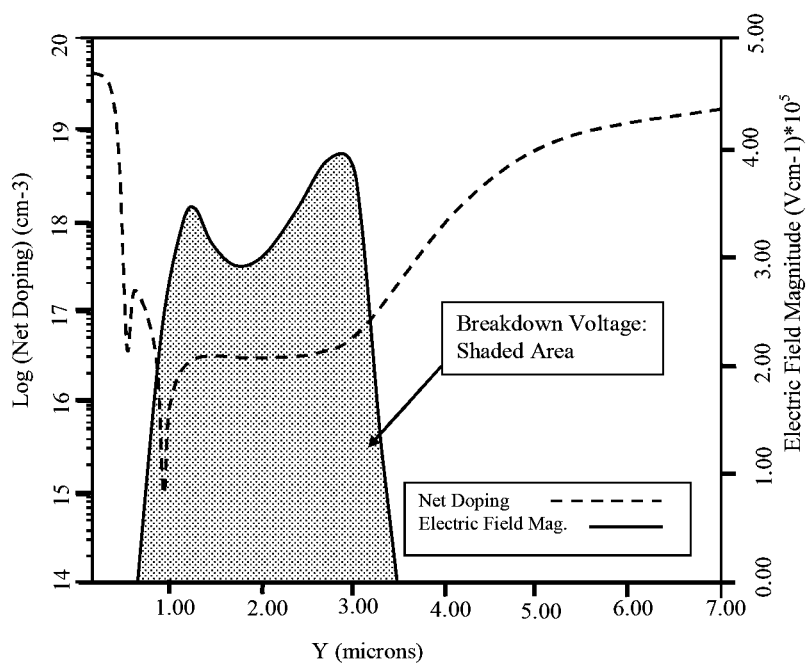
FIG. 3B – Conventional SGT MOSFET

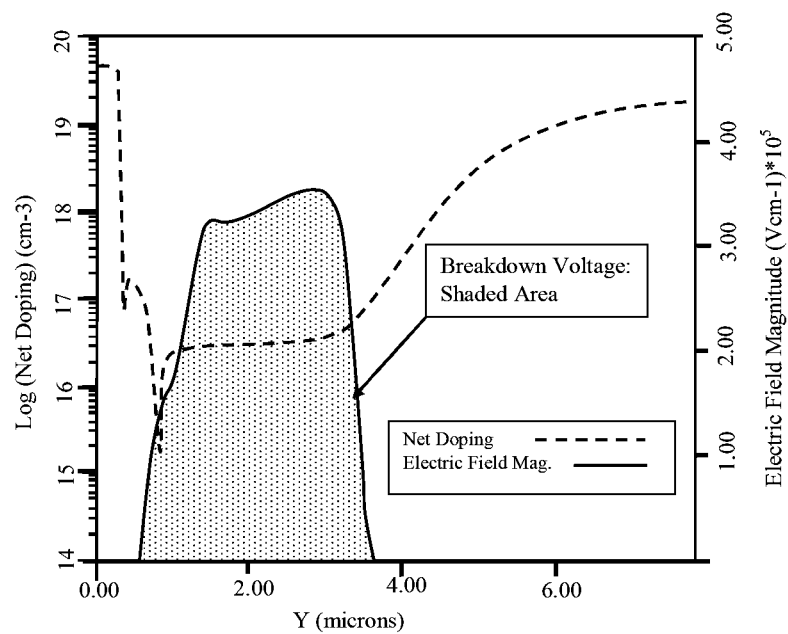
FIG. 3C – TBO trench MOSFET with electron irradiation

12
MOSFET WITH IMPROVED PERFORMANCE THROUGH INDUCED NET CHARGE REGION IN THICK BOTTOM INSULATOR

FIELD OF THE INVENTION

This invention relates in general to semiconductor power field effect transistor devices and in particular to thick bottom oxide (TBO) MOSFET devices with improved drain to source on-resistance.

BACKGROUND OF THE INVENTIONS

Conventional technologies to configure and manufacture high voltage semiconductor power devices are still confronted with difficulties and limitations to further improvement of device performances due to different tradeoffs. In vertical semiconductor power devices, there is a tradeoff between the drain to source resistance, i.e., on-resistance, commonly represented by $R_{ds}A$ (i.e., $R_{ds}$ X unit Area) as a performance characteristic, and the breakdown voltage sustainable of the power device. For the purpose of reducing the $R_{ds}A$, an epitaxial layer is formed with higher dopant concentration. However, a heavily doped epitaxial layer also reduces the breakdown voltage that can be sustained by the semiconductor power device.

Several device configurations have been explored in order to resolve the difficulties and limitations caused by these performance tradeoffs. FIG. 1A illustrates a conventional a power transistor in the form of a P-channel trench metal-oxide-semiconductor field effect transistor (MOSFET) 100. The MOSFET 100 is formed in a P-type semiconductor substrate 101, which acts as the drain of the MOSFET 100. A p-type epitaxial region 102, also known as a drift region, is formed on an upper portion of the substrate 101. An n-type body region 106 is formed on or in the drift region 102, forming the body of the MOSFET 100. A trench 107 is formed within the body region 106 and drift/epitaxial region 102. An insulated gate structure is formed in a trench 107 having a bottom in the drift region and opposing sidewalls extending adjacent the drift region for modulating the conductivity of the channel and drift regions in response to the application of a turn-on gate bias. The insulated gate structure includes an electrically conductive gate electrode 104 in the trench 107 and a dielectric material 109, which is also called a gate oxide (Gox), lining a sidewall of the trench adjacent the channel and drift regions. The gate electrode 104 is insulated from adjacent regions. A P+ source region 108 is formed within a top layer of the body region 106. However, to achieve high breakdown voltage, the drift region doping concentration need to be low enough, this result in high resistance at the p-n junctions between the n-type body layer 106 and the p-type substrate 102 is high, and hence there is high $R_{ds}A$ for devices formed this way.

To reduce $R_{ds}A$ and increase breakdown voltage $V_{BD}$, shielded gate trench (SGT) MOSFETs are preferred for certain applications over conventional trench MOSFETs because they provide several advantageous characteristics. FIG. 1B shows the cross section of a p-channel SGT MOSFET 150, which includes a p-type substrate 101 such as silicon that acts as the drain, a p-type epitaxial or drift region 102, and an n-type body region 106, which can be similar in configuration to corresponding features in FIG. 1A. A trench 157 is formed within the body region 106 and drift/epitaxial region 102 and extends to the bottom of the epitaxial region 102. A shield electrode 152 typically composed of polysilicon, also called poly 1, is deposited within the trench 157 and is insulated from adjacent regions by dielectric material 160, which is also called a liner oxide (liner OX). A gate electrode 154, which when made of polysilicon is commonly called poly 2, is deposited within the trench 157 and above the shield electrode 152. The gate electrode 154 is insulated from adjacent regions by a thin dielectric material 159, also call a gate oxide (Gox). A P+ source region 108 is formed within a top portion of the body region 106. When a positive voltage is applied to the gate electrode 154, the MOSFET device 150 turns on and a conducting channel is formed vertically within the body region 106 between the source 108 and the drift/epitaxial region 102 along the walls of the trench 157.

Shielded gate trench MOSFETs exhibit reduced on-resistance $R_{ds}A$ and increased breakdown voltage of the transistor. For conventional trench MOSFETs, the placement of many trenches in a channel, while decreasing the on-resistance, also increases the overall gate-to-drain capacitance. The introduction of the shielded gate trench MOSFET structure remedies this issue by shielding the gate from the electric field in the drift region (drain). The shielded gate trench MOSFET structure also provides the added benefit of higher doping concentration in the drift region for the device's breakdown voltage, and hence a better tradeoff between BV and RdsA.

Although the SGT provides advantages, the process of manufacturing SGT MOSFET devices is more complicated because it requires a dual poly process, in which the step of etching back the shield electrode, or poly 1, is difficult to control. In addition, one extra mask is also required for poly 1 linkup. Furthermore, the SGT MOSFET structure presents challenges in forming the dielectric isolation between the shield electrode and gate electrode.

It is within this context that embodiments of the present invention arise.

BRIEF DESCRIPTION OF THE DRAWINGS

Other objects and advantages of the invention will become apparent upon reading the following detailed description and upon reference to the accompanying drawings in which:

FIG. 1A is a cross-sectional schematic diagram illustrating a conventional trench MOSFET.

FIG. 1B is a cross-sectional schematic diagram illustrating a conventional shield gate trench (SGT) MOSFET.

FIG. 2A is a cross-sectional schematic diagram illustrating a conventional thick bottom oxide (TBO) MOSFET.

FIG. 2B is a cross-sectional schematic diagram illustrating a thick bottom oxide (TBO) MOSFET applied electron irradiation for charge balance in accordance with a preferred embodiment of the present invention.

FIGS. 3A-3C are plots illustrating the breakdown voltage of the conventional trench MOSFET, conventional SGT MOSFET and the TBO MOSFET of the present invention respectively.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Introduction

In embodiments of the present invention a MOSFET structure known as a thick bottom oxide (TBO) structure is modified to provide the advantages of a shielded gate transistor (SGT) while avoiding the difficulties in fabricating such a device.

FIG. 2A shows the cross section of a conventional P-channel thick bottom oxide (TBO) trench MOSFET 200 implemented with thick bottom oxide in the trench gate to improve the electrical field shape that allows higher breakdown voltage than the conventional trench MOSFET as shown in FIG. 1A. The structure of the TBO trench MOSFET 200 is similar to the structure of the trench MOSFET 100, which includes a P-type semiconductor substrate 101 that acts as the drain of the MOSFET 200, a p-type epitaxial/drift region 102 formed on the substrate 101, an n-type body region 106 formed in the drift region 102, and a P+ source region 108 formed within a top portion of the body region 106.

A trench 207 is formed within the body region 106 and extends to the bottom of the drift/epitaxial region 102. The trench 207 has a bottom in the drift region and opposing sidewalls extending adjacent the drift region. An insulated gate structure is formed in the trench 207. The gate structure includes an electrically conductive gate 204 and a thick insulator material region 206 (e.g., a thick bottom oxide), at the bottom portion of the trench and a thin dielectric material layer 209 e.g., a gate oxide (Gox), lining a sidewall of the trench adjacent the channel and drift regions.

The gate electrode 204 is insulated from adjacent portions of the epitaxial semiconductor region 102 by the thin dielectric material 209. Unlike the conventional MOSFET 100, the dielectric material 206 (sometimes called a bottom oxide) underneath the gate electrode 204 is thicker, e.g., about 0.05 μm to 1.0 μm. The gate oxide thickness, by contrast, is about 100-1000 Å. The relatively thick bottom oxide 206 in the trench gate lowers the gate to drain coupling, thereby lowering the gate to drain charge $Q_{gd}$.

Embodiments

According to an embodiment of the present invention, the drift/epitaxial region 102 in a TBO MOSFET may be doped with high doping concentration to reduce the RdsA while maintain high breakdown voltage by the RESURF (reduced surface fields) effect. In general, the doping concentration is roughly two to five times the doping concentration for a conventional (unshielded) MOSFET depending on the voltage rating of the device.

A shield electrode in an SGT, such as that shown in FIG. 1B, is a conventional way to implement the RESURF effect with a complicated double poly process. In embodiments of the present invention, by contrast, an innovative technique is presented to achieve the same RESURF effect but with much a simpler single poly process. An example of a device structure 250 formed by this technique is shown in FIG. 2B. Unlike the conventional TBO trench MOSFET 200, the dielectric material 206 underneath the gate electrode 204 is thicker, about 2 μm to 5 μm. A region of net positive charge 205 may be induced in the dielectric material 206 proximate a dielectric-semiconductor interface 210 (e.g., an oxide-silicon interface) by applying electron irradiation followed by high temperature annealing of the device. This step can be applied to either the manufactured wafers after all other process have been completed or before backside grinding and metallization in wafer fabrication. The electron irradiation induces hole-electron pairs at the semiconductor-dielectric interface. Electrons can move out of the dielectric material leaving holes at the dielectric-semiconductor interface. The energy and dose of electron irradiation can be selected to cause a suitable hole (i.e., positive charge) density at the interface 210. By way of example, the electron energy can range from about 1 MeV to about 30 MeV, preferably, between about 3 MeV and about 10 MeV. The electron dose depends on the thickness of the dielectric 206, and the semiconductor doping concentration of region 207. Generally, a higher electron dose is needed for a more highly doped semiconductor (e.g., epitaxial silicon). The general range of total dose may be from about 1 Mrad to about 10 Mrad.

The electron irradiation induced positive charge at the interface depletes the doping in portions of the epitaxial region 102 proximate the trench 207 allowing the heavily doped epitaxial region 102 to support a higher breakdown voltage while keeping $R_{ds}A$ low.

It is noted that electron irradiation is conventionally used in semiconductor processing to kill carrier lifetime. However, so far as is known, electron irradiation has not been used to deliberately induce charges at a semiconductor dielectric interface in a TBO MOSFET, in a manner that is intended to implement the RESURF effect.

The process of making a P-type TBO trench MOSFET of the type shown in FIG. 2B is similar to the process of making a conventional TBO trench MOSFET except for an additional step of the electron irradiation as described above for charge balancing and threshold voltage adjustment. After electron irradiation, and before dicing or packaging, the wafer is annealed at a temperature about 250° C. to 450° C., preferably about 300° C. to 400° C. for a recovery of the electron irradiation induced defects in the epitaxial region 102 but not complete recovery at the interface 210 of the oxide in the TBO and the epitaxial layer such that irradiation induced positive charges remain at the interface. As a result, the device RESURF effect can be achieved while avoiding defects that induce device performance distortion, such as high IDSS leakage etc.

Simulations

Simulations have been done comparing a 60V conventional trench MOSFET device structure like that shown in FIG. 1A, a 60V SGT MOSFET like that shown in FIG. 1B, and a 60V TBO trench MOSFET with electron irradiation induced charge at the interface like that shown in FIGS. 2A-2B. Table I shows the detail structure of each device.

TABLE I

| Device | Trench Depth | Gox thickness | Liner oxide thickness | TBO thickness |
| --- | --- | --- | --- | --- |
| Conventional trench MOSFET | 1.5 μm-2.5 μm | 400 Å-800 Å | n/a | n/a |
| SGT MOSFET | 3.5 μm-4.5 μm | 400 Å-800 Å | 3000 Å-5000 Å | n/a |
| TBO trench MOSFET with irradiation | 3.5 μm-4.5 μm | 400 Å-800 Å | n/a | 2 μm-4 μm |

A comparison of the performance of the devices is shown in Table II.

TABLE II

| Device | BV | $V_{th}$ | $R_{ds}A$ (at −10 V) |
|---|---|---|---|
| Conventional trench MOSFET | 68 | 2.5 | 77 |
| SGT MOSFET | 68 | 2.2 | 47 |
| TBO trench MOSFET with irradiation | 68 | 2.5 | 48 |

In Table II BV refers to the breakdown voltage, $V_{th}$ refers to the threshold voltage for turning on the device channel at a drain source current $I_{DS}$=−250 μA, which is a standard condition for $V_{th}$ measurement for power MOSFET.

As shown Table II, for the same BV, the $R_{ds}A$ of the TBO trench MOSFET with electron irradiation is about the same as the $R_{ds}A$ of the SGT MOSFET, which is about 40% less than the $R_{ds}A$ of the conventional trench MOSFET. These results illustrate that TBO MOSFETS in accordance with embodiments of the invention can potentially achieve device performance comparable to that of an SGT MOSFET but with a much simpler construction.

FIGS. 3A-3C are plots illustrating the electric field magnitude and net doping concentration in the epitaxial layer as functions of depth for the conventional trench MOSFET, the SGT MOSFET and the TBO trench MOSFET with electron irradiation respectively. The breakdown voltage for each device may be calculated from the shaded area under the solid line representing the electric field magnitude. The dashed line presents the net doping concentration along the depth of the epitaxial layer. As shown in these figures, the doping concentration of the epitaxial layer of the SGT MOSFET (FIG. 3B) and of the TBO trench MOSFET with electron irradiation (FIG. 3C) are almost double the doping concentration of the conventional trench MOSFET (FIG. 3A), however the BV, which is the shaded area under the electric field line, of the SGT MOSFET (FIG. 3B) and of the TBO trench MOSFET with electron irradiation is the same as the BV of the conventional trench MOSFET (FIG. 3A).

Thus, the electron irradiation technique is found to be effective in improvement of the breakdown voltage and the $R_{ds}A$ trade-off of the power MOSFET and improves the $R_{DS}*C_{rss}$ figure of merit (FOM).

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶ 6.

What is claimed is:

1. A semiconductor power device, comprising:
a semiconductor substrate having dopants of a first conductivity type;
an epitaxial semiconductor region formed on the substrate doped with dopants of the first conductivity type to a lower doping concentration than the substrate;
a trench formed in the epitaxial semiconductor region;
a body region formed in the epitaxial semiconductor region proximate the trench, wherein the body region is doped dopants of a second conductivity type that is opposite the first conductivity type;
a source region of the first conductivity type formed proximate the trench such that the body region is between the source region and the epitaxial region, wherein a doping concentration of the source region is greater than a doping concentration of the epitaxial semiconductor region;
a thick bottom insulator formed in a lower portion of the trench;
an electrically conductive gate electrode formed in the trench above the thick bottom insulator, wherein the gate electrode is electrically insulated from a bottom of the trench by the thick bottom insulator and electrically insulated from sidewalls of the trench by a gate insulator; and
a region of induced net charge of the first conductivity type in the thick bottom insulator proximate an interface between the thick bottom insulator and the epitaxial semiconductor region, wherein the doping concentration of the epitaxial semiconductor region is two to three times the doping concentration for an epitaxial semiconductor region in a conventional (unshielded) MOSFET device.

2. The semiconductor power device of claim 1, wherein the first conductivity type is P-type.

3. The semiconductor power device of claim 2, wherein region of induced net charge is a result of electron irradiation of the epitaxial region.

4. The semiconductor power device of claim 3, wherein the induced net charge is most heavily concentrated at the interface between the thick bottom insulator and the epitaxial semiconductor region.

5. The semiconductor power device of claim 1, wherein a thickness of the thick bottom insulator between the gate electrode and a bottom of the trench is between about 2 microns and about 5 microns.

6. The semiconductor power device of claim 5, wherein the region of induced net charge is concentrated in the epitaxial semiconductor region between the gate electrode and a bottom of the trench proximate the interface between the thick bottom insulator and the epitaxial semiconductor region.

7. The semiconductor power device of claim 1 wherein the thick bottom insulator includes an oxide.

8. The semiconductor power device of claim 1 wherein the gate insulator includes an oxide.

9. A method for manufacturing a semiconductor power device, comprising:
forming an epitaxial semiconductor region on a substrate doped with dopants of a first conductivity type,
doping the epitaxial semiconductor region with dopants of the first type to a lower doping concentration than the substrate;
forming a trench in the epitaxial semiconductor region;
forming a body region in the epitaxial semiconductor region proximate the trench, wherein the body region is doped dopants of a second conductivity type that is opposite the first conductivity type;
forming a source region of the first conductivity type proximate the trench such that the body region is between the source region and the epitaxial region, wherein a doping concentration of the source region is greater than a doping concentration of the epitaxial semiconductor region;

forming a thick bottom insulator in a lower portion of the trench;

forming an electrically conductive gate electrode in the trench above the thick bottom insulator, wherein the gate electrode is electrically insulated from a bottom of the trench by the thick bottom insulator and electrically insulated from sidewalls of the trench by a gate insulator; and deliberately inducing a region of net charge of the first conductivity type in the thick bottom insulator proximate an interface between the thick bottom insulator and the epitaxial semiconductor region, wherein the doping concentration of the epitaxial semiconductor region two to three times the doping concentration for an epitaxial semiconductor region in a conventional (unshielded) MOSFET device.

10. The method of claim 9, wherein the first conductivity type is P-type.

11. The method of claim 10, wherein deliberately inducing the region of net charge includes electron irradiation of the epitaxial region in a manner configured to induce defects in the epitaxial semiconductor region.

12. The method of claim 11, further comprising annealing the epitaxial semiconductor region to promote partial recovery of electron irradiation induced defects in the epitaxial region but incomplete recovery at the interface between the thick bottom insulator and the epitaxial semiconductor region, whereby some defects remain at the interface to attract charge to the interface.

13. The method of claim 12, wherein the annealing is performed at a temperature between about 250° C. and about 450° C.

14. The method of claim 13, wherein the annealing is performed at a temperature between about 300° C. and about 400° C.

15. The method of claim 11, wherein the defects induced by the electron irradiation are most heavily concentrated at the interface between the thick bottom insulator and the epitaxial semiconductor region.

16. The method of claim 11, wherein the defects induced by the electron irradiation are concentrated in the epitaxial semiconductor region between the gate electrode and a bottom of the trench.

17. The method of claim 9, wherein a thickness of the thick bottom insulator between the gate electrode and a bottom of the trench is between about 2 microns and about 5 microns.

18. The method of claim 9, wherein the thick bottom insulator includes an oxide.

19. The method of claim 9, wherein the gate insulator includes an oxide.

* * * * *